United States Patent [19]
Hikata et al.

[11] Patent Number: 5,663,120
[45] Date of Patent: *Sep. 2, 1997

[54] METHOD OF PREPARING OXIDE HIGH-TEMPERATURE SUPERCONDUCTOR

[75] Inventors: Takeshi Hikata; Kenichi Sato, both of Osaka, Japan

[73] Assignee: Sumitomo Electric Industries, Ltd., Japan

[*] Notice: The term of this patent shall not extend beyond the expiration date of Pat. No. 5,378,684.

[21] Appl. No.: 316,262

[22] Filed: Sep. 29, 1994

Related U.S. Application Data

[63] Continuation of Ser. No. 757,103, Sep. 10, 1991, Pat. No. 5,378,684.

[30] Foreign Application Priority Data

Sep. 10, 1990 [JP] Japan ................................ 2-240384

[51] Int. Cl.$^6$ ................................................ H01L 39/24
[52] U.S. Cl. ............................ 505/430; 505/500; 148/96
[58] Field of Search ...................... 505/430, 433, 505/500, 501, 739, 740, 742; 148/96

[56] References Cited

U.S. PATENT DOCUMENTS

| | | | |
|---|---|---|---|
| 5,264,414 | 11/1993 | Subramanian | 505/501 |
| 5,288,699 | 2/1994 | Sato et al. | 505/433 |
| 5,378,684 | 1/1995 | Hirata et al. | 505/430 |

*Primary Examiner*—George Wyszomierski
*Attorney, Agent, or Firm*—Pennie & Edmonds LLP

[57] ABSTRACT

In order to prevent expansion of a metal sheath which is heat treated in order to form an oxide high-temperature superconductor therein, the heat treatment temperature is held at a certain level in an intermediate stage of temperature rising in a step of heat treating the metal sheath after filling raw material for an oxide high-temperature superconductor into the metal sheath. After the heat treatment temperature is thus held at the certain level, the metal sheath is again heated to a target temperature. Preferably, the heat treatment temperature is held at a level which is selected in a range of at least 500° C. and not more than 750° C.

3 Claims, No Drawings

METHOD OF PREPARING OXIDE HIGH-TEMPERATURE SUPERCONDUCTOR

This is a continuation of application Ser. No. 07/757,103, filed Sep. 10, 1991, now U.S. Pat. No. 5,378,684.

BACKGROUND OF THE INVENTION

1. Field of the Invention

The present invention relates to a method of preparing an oxide high-temperature superconductor, and more particularly, it relates to a method of preparing an oxide high-temperature superconductor, which can improve the critical current density and is suitable for preparation of a long wire.

2. Description of the Background Art

In recent years, superconductive materials of ceramics, i.e., oxide superconductive materials, are watched as materials which exhibit higher critical temperatures. In particular, a yttrium-based material, a bismuth-based material and a thallium-based material, which exhibit high critical temperatures of about 90 K, 110 K and 120 K respectively, are expected as practicable superconductive materials.

It is known that a bismuth superconductor has a phase showing a critical temperature of 110 K and those showing critical temperatures of 80 K and 10 K, in particular. It is also known that the 110 K phase has a 2223 composition in a composition of Bi-Sr-Ca-Cu, or (Bi,Pb)-Sr-Ca-Cu with partial substitution of Pb for Bi, while the 80 K phase has a 2212 composition of the same elements.

In a general method of preparing an oxide superconductor, raw material for the oxide superconductor is filled into a metal sheath and subjected to deformation processing and heat treatment, so that the raw material contained in the metal sheath is brought into a superconducting state. This method is advantageously applied to preparation of a long superconducting wire, for example.

In order to apply a superconductor to a cable or a magnet, it is necessary to provide a wire, which is formed by such a superconductor, with a high critical current density, in addition to a high critical temperature. Further, such a high critical current density must be homogeneous along the longitudinal direction of the wire.

When the aforementioned method of forming a superconductor in a metal sheath is employed in order to obtain a long wire, however, the superconductor is provided in a state enclosed by the metal sheath and basically cut off from the external atmosphere. Upon heat treatment, therefore, the wire is expanded by gas which is generated from the raw material powder contained in the metal sheath. Thus, the superconductor which is enclosed by the metal sheath may be cracked upon handling during or after the heat treatment etc., to reduce the critical current density of the wire.

SUMMARY OF THE INVENTION

Accordingly, an object of the present invention is to provide, in relation to a method of preparing an oxide high-temperature superconductor comprising a step of performing heat treatment for forming an oxide high-temperature superconductor in a metal sheath, technical means which can provide a homogeneous critical current density over the longitudinal direction as well as improve the critical current density.

The present invention is adapted to prevent expansion of a metal sheath when the same is heat treated for forming an oxide high-temperature superconductor therein, and is characterized in that a step of heat treating the metal sheath after filling raw material for the oxide high-temperature superconductor into the metal sheath comprises a process of holding the heat treatment temperature at a certain level in an intermediate stage of temperature rising. Thus, the heat treatment temperature is temporarily held at a certain level, and thereafter raised up to a target level.

The heat treatment temperature is preferably held at a level which is selected in a range of at least 500° C. and not more than 750° C.

The metal sheath is preferably made of silver or a silver alloy.

The present invention is particularly advantageously directed to the so-called bismuth superconductor of Bi-Sr-Ca-Cu, (Bi,Pb)-Sr-Ca-Cu or the like. In this case, the metal sheath is filled with powder containing a 2223 phase, a 2212 phase and/or non-superconducting phases.

The wire is expanded during heat treatment since the gas generated from the powder which is contained in the metal sheath cannot quickly escape from the metal sheath but produces a gas pressure. According to the present invention, it is possible to quickly discharge the gas from the metal sheath. In the temperature rising process of the heat treatment, the heat treatment temperature is held at a certain level so that the metal sheath has sufficient strength against expansion under this temperature, although the gas is generated from the powder which is contained in the metal sheath. Thus, it is possible to quickly discharge the gas without expanding the wire by stopping temperature rising in an intermediate stage of the heat treatment and temporarily holding the heat treatment temperature at a certain level.

According to the present invention, therefore, it is possible to obtain an oxide high-temperature superconductor which has a high critical current with superior homogeneity of superconducting properties such as the critical current density.

DESCRIPTION OF THE PREFERRED EMBODIMENTS $Bi_2O_3$, PbO, $SrCO_3$, $CaCO_3$ and CuO were employed to prepare powder containing Bi, Pb, Sr, Ca and Cu in composition ratios of 1.8:0.4:2:2.2:3.

This powder was heat treated at 800° C. for 8 hours, and the heat treated powder was pulverized in an automatic mortar for 2 hours. Thereafter the pulverized material was heat treated at 860° C. for 8 hours, and the heat treated material was again pulverized in a similar manner to the above. The pulverized material was heated at 760° C. for 3 hours under a reduced pressure of 5 Torr, and thereafter filled into a silver pipe of 6 mm in outer diameter and 4 mm in inner diameter, which in turn was subjected to wire drawing and rolling.

Samples of the as-formed wire were heat treated with temperature rising at a rate of 5° C./min. As shown in Table 1, such temperature rising was temporarily stopped at the following levels:

(1) 400° C.
(2) 500° C.
(3) 650° C.
(4) 750° C.
(5) 800° C.

The heat treatment temperatures were held for 2 hours at the respective levels, and thereafter raised up to 845° C. at a rate of 5° C./min. The samples were held at this temperature for 50 hours in the atmospheric air for heat treatment, and then slowly cooled.

As shown in Table 1, the samples which were held at the temperatures of (1) 400° C. and (5) 800° C. were expanded, while no expansion was observed in those which were held at the temperatures of (2) 500° C., (3) 650° C. and (4) 750° C. corresponding to a temperature range between 400° C. and 800° C.

Thereafter the samples were rolled into 0.14 mm in thickness, and heat treated at 840° C. for 50 hours. As shown in Table 1, the samples (2), (3) and (4) exhibited higher critical current densities ($J_c$), with excellent homogeneity.

TABLE 1

| Temperature Level | 400° C. | 500° C. | 650° C. | 750° C. | 800° C. |
|---|---|---|---|---|---|
| Sample No. | (1) | (2) | (3) | (4) | (5) |
| Expansion | Yes | No | No | No | Yes |
| Jc | A/cm$^2$ | A/cm$^2$ | A/cm$^2$ | A/cm$^2$ | A/cm$^2$ |
| Wire Length | | | | | |
| 1 m | 15000 | 28000 | 30500 | 29000 | 14000 |
| 2 m | 12000 | 25000 | 31000 | 28500 | 12000 |
| 5 m | 9800 | 23000 | 29000 | 25000 | 10000 |
| 10 m | 7500 | 21000 | 27000 | 23000 | 6700 |
| 20 m | 5500 | 20000 | 26000 | 21000 | 5200 |

What is claimed is:

1. A method of preparing an oxide high-temperature superconductor in a metal sheath comprising the steps of:

(a) maintaining a metal sheath containing a ceramic material capable of being superconductive at a constant intermediate temperature during heat treatment; and (b) removing gas formed during said heat treatment from said metal sheath while maintaining said sheath at said constant intermediate temperature during heat treatment wherein under said constant intermediate temperature the metal sheath does not expand during said step of removing gas.

2. A method of preparing an oxide high-temperature superconductor in a metal sheath in accordance with claim 1, wherein said metal sheath is made of silver or a silver alloy.

3. A method of preparing an oxide high-temperature superconductor in a metal sheath in accordance with claim 1, wherein said oxide high-temperature superconductor comprises bismuth cuprate.

* * * * *